United States Patent [19]
Lin et al.

[11] Patent Number: 5,748,535
[45] Date of Patent: May 5, 1998

[54] ADVANCED PROGRAM VERIFY FOR PAGE MODE FLASH MEMORY

[75] Inventors: Tien-Ler Lin, Saratoga, Calif.; Kota Soejima; Jun Takahashi, both of Kawasaki, Japan; Chun-Hsiung Hung, Hsin-Chu, Taiwan; Kong-Mou Liou, San Jose; Ray-Lin Wan, Milpitas, both of Calif.

[73] Assignee: Macronix International Co., Ltd., Hsinchu, Taiwan

[21] Appl. No.: 612,968

[22] PCT Filed: Jan. 5, 1995

[86] PCT No.: PCT/US95/00077

§ 371 Date: Mar. 4, 1996

§ 102(e) Date: Mar. 4, 1996

[87] PCT Pub. No.: WO96/21227

PCT Pub. Date: Jul. 11, 1996

Related U.S. Application Data

[63] Continuation-in-part of Ser. No. 325,467, Oct. 26, 1994.

[51] Int. Cl.$^6$ .................................................. G11C 7/00
[52] U.S. Cl. .............................. 365/185.22; 365/185.05; 365/185.11
[58] Field of Search .................. 365/185.12, 185.11, 365/185.22, 189.05

[56] References Cited

U.S. PATENT DOCUMENTS

| | | | |
|---|---|---|---|
| 4,054,864 | 10/1977 | Audaire et al. | 340/173 R |
| 4,811,294 | 3/1989 | Kobayashi et al. | 365/189 |
| 4,890,259 | 12/1989 | Simko | 365/45 |
| 5,163,021 | 11/1992 | Mehrotra et al. | 365/185 |
| 5,218,569 | 6/1993 | Banks | 365/189.01 |
| 5,245,570 | 9/1993 | Fazio et al. | 365/185 |
| 5,283,758 | 2/1994 | Nakayama et al. | 365/185 |
| 5,294,819 | 3/1994 | Simko | 257/314 |
| 5,297,081 | 3/1994 | Challa | 365/185.12 |
| 5,323,351 | 6/1994 | Challa | 365/218 |
| 5,357,463 | 10/1994 | Kinney | 365/185 |
| 5,363,330 | 11/1994 | Kobayashi et al. | 365/185.05 |
| 5,369,609 | 11/1994 | Wang et al. | 365/185.12 |
| 5,379,256 | 1/1995 | Tanaka et al. | 365/189.09 |
| 5,414,658 | 5/1995 | Challa | 365/185.06 |
| 5,418,743 | 5/1995 | Tomioka et al. | 365/189.01 |
| 5,422,845 | 6/1995 | Ong | 365/185 |
| 5,450,363 | 9/1995 | Christopherson et al. | 365/205 |
| 5,615,149 | 3/1997 | Kobayashi et al. | 365/185.12 |
| 5,625,590 | 4/1997 | Choi et al. | 365/185.17 |
| 5,638,326 | 6/1997 | Hollmer et al. | 365/185.2 |
| 5,646,886 | 7/1997 | Brahmbhatt | 365/185.16 |

FOREIGN PATENT DOCUMENTS

| | | | |
|---|---|---|---|
| WO 95/00077 | 1/1995 | WIPO | A61B 19/00 |
| WO 95/34074 | 12/1995 | WIPO | G11C 11/56 |
| WO 95/34075 | 12/1995 | WIPO | G11C 13/00 |

OTHER PUBLICATIONS

Jung, T. et al., "A 3.3V 128Mb Multi-Level NAND Flash Memory for Mass Storage Applications", 1996 IEEE International Solid-State Circuits Conference, Digest of Technical Papers, Feb. 1996, pp. 32-33.

(List continued on next page.)

*Primary Examiner*—Vu A. Le
*Attorney, Agent, or Firm*—Mark A. Haynes; Wilson, Sonsini, Goodrich & Rosati

[57] ABSTRACT

Flash EEPROM cell and array designs, and methods for programming the same result in efficient and accurate programming of a flash EEPROM chip. The flash EEPROM chip comprises a memory array including at least M rows and N columns of flash EEPROM cells. M word lines are each coupled to the flash EEPROM cells in one of the M rows of flash EEPROM cells. A plurality of bit lines are each coupled to the flash EEPROM cells in one of the N columns of flash EEPROM cells. A page buffer coupled to the plurality of bit lines supplies input data to N columns of flash EEPROM cells. Write control circuitry supplies programming voltages for programming input data to the flash EEPROM cells in response to the input data stored in the data input buffer. Verify circuitry automatically verifies programming of the page by resetting bits in the page buffer for each cell which passes.

26 Claims, 10 Drawing Sheets

OTHER PUBLICATIONS

Bauer, M. et al., "A Multilevel–Cell 32Mb Flash Memory", 1995 IEEE International Solid–State Circuits Conference, Digest of Technical Papers, Feb. 1995, pp. 132–133.

Mills, D. et al., "A 3.3V 50MHz Synchronous 16Mb Flash Memory", Digest of Techical Papers, 1995 IEEE International Solid–State Circuits Conference, Session 7, Feb. 16, 1995, pp. 119–131.

Suh, K. et al., "A 3.3V 32Mb NAND Flash Memory with Incremental Step Pulse Programming Scheme", 1995 IEEE International Solid–State Circuits Conference, Digest of Tech. Papers, Feb. 1995, pp. 128–129.

Tanaka, et al., "High–Speed Programming and Program–Verify Methods Suitable for Low–Voltage Flash Memories," *1994 Symposium on VLSI Circuits Digest of Technical Papers*, 1994 IEEE, pp. 61–62.

5,748,535

ADVANCED PROGRAM VERIFY FOR PAGE MODE FLASH MEMORY

CONTINUING APPLICATION DATA

The present application is a continuation-in-part of PCT Application No. US 94/10331, filed Sep. 13, 1994, published as WO96/21227 Jul. 11, 1996, now U.S. patent application Ser. No. 08/325,467, filed Oct. 26, 1994, entitled FLASH EPROM INTEGRATED ARCHITECTURE, invented by Yiu, et al.

BACKGROUND OF THE INVENTION

1. Field of the Invention

The present invention relates to flash EEPROM memory technology, and more particularly to an improved flash EEPROM memory architecture for automatic program verify and for page programming.

2. Description of Related Art

Flash EEPROMs are a growing class of non-volatile storage integrated circuits. The memory cells in a flash EEPROM are formed using so-called floating gate transistors in which the data is stored in a cell by charging or discharging the floating gate. The floating gate is a conductive material, typically made of polysilicon, which is insulated from the channel of the transistor by a thin layer of oxide, or other insulating material, and insulated from the control gate of the transistor by a second layer of insulating material.

The floating gate may be charged through a Fowler-Nordheim tunneling mechanism by establishing a large positive voltage between the gate and source or drain. This causes electrons to be injected into the floating gate through the thin insulator. Alternatively, an avalanche injection mechanism, known as hot electron injection, may be used by applying potentials to induce high energy electrons in the channel of the cell which are injected across the insulator to the floating gate. When the floating gate is charged, the threshold voltage for causing the memory cell to conduct is increased above the voltage applied to the word line during a read operation. Thus, when a charged cell is addressed during a read operation, the cell does not conduct. The non-conducting state of the cell can be interpreted as a binary 1 or 0 depending on the polarity of the sensing circuitry.

The floating gate is discharged to establish the opposite memory state. This function is typically carried out by an F-N tunneling mechanism between the floating gate and the source or the drain of the transistor, or between the floating gate and the substrate. For instance, the floating gate may be discharged through the drain by establishing a large positive voltage from the drain to the gate, while the source is left at a floating potential.

The high voltages used to charge and discharge the floating gate place significant design restrictions on flash memory devices, particularly as the cell dimensions and process specifications are reduced in size.

Furthermore, the act of charging and discharging the floating gate, particularly when using the F-N tunneling mechanism, is a relatively slow process that can restrict the application of flash memory devices in certain speed sensitive applications.

Another process which slows down flash memory devices is program verify. After applying a program sequence, successful programming must be verified, and if a failure is detected, then the programming is retried. Program retries are typically executed word by word or byte by byte. Thus, bits successfully programmed in a byte with one failed bit are subjected to the program cycle repeatedly. This can result in over programming and failure of the cell. For one approach to this issue, see U.S. patent application Ser. No. 5,163,021 by Mehrotra, et al., et seq. at col. 19, line 10 et seq. and FIGS. 14–17.

Therefore, it is desirable to provide a flash EEPROM cell architecture, and a method of programming the same which overcome speed penalties and over-programming failures of the prior art.

SUMMARY OF THE INVENTION

The present invention provides novel flash EEPROM cell and array designs, and methods for programming the same which result in improved speed. The novel flash EEPROM array design is based on "page mode" programming, which operates by writing a row of data which constitutes a page, including, for example, as many as 1024 flash EEPROM cells in parallel. Thus, according to one aspect of the present invention, a flash EEPROM transistor array is provided. The memory array has a plurality of flash EEPROM cells for storing data. Supply circuits apply voltages to the plurality of flash EEPROM cells to read and program the plurality of flash EEPROM cells in the memory array. A page buffer including a plurality of bit latches coupled to corresponding bit lines, provide for storage of a page of data to a row of flash EEPROM cells along a single wordline in the memory array. Control logic controls the supply circuits in response to the memory data in the bit latches and address signals to program the data to the plurality of flash EEPROM cells in the row. Data verify circuits automatically verify successful programming of the memory data to each cell in the row, and reset a corresponding bit latch upon successful verify. A page verified signal is generated when the row of cells pass verify as indicated by all bit latches in the reset state; else the program operation is retried.

According to one aspect of the present invention, the memory array includes at least M rows and N columns of flash EEPROM cells. The bit latches provide the memory data for storage to the row of flash EEPROM cells so that the entire row of flash EEPROM cells is programmed in a programming sequence. After an entire row of flash EEPROM cells is programmed, the data in the programmed flash EEPROM cells are verified. The data verify circuits include verify logic which reads the memory data from the flash EEPROM cell and resets the bit latch to provide a cell data verify signal when the memory data from the flash EEPROM cell indicates a programmed state in the bit latch. Thus, the verify logic provides for automatic program verify of the memory data in the flash EEPROM cell. The memory data from each flash EEPROM cell in the row of flash EEPROM cells is compared with the memory data in the corresponding bit latch and is automatically verified.

According to yet another aspect of the present invention, the data verify circuits include output logic which provides the page verify signal when all cell data verify signals are received for the flash EEPROM cells being verified. When the output logic does not provide the page verify signal, retry logic reprograms flash EEPROM cells that fail program verify. The retry logic further includes logic which counts reprogram retries and sets a reprogram limit on retries.

According to another aspect of the present invention, the program verify circuitry includes logic which reads programmed input data from the flash EEPROM cells and compares the programmed input data with the data of the bit latch to provide the program verified signal when all programmed flash EEPROM cells pass program verify. The logic automatically provides the program verified signal when all programmed flash EEPROM cells pass program verify.

According to another characterization of the present invention, a method of storing data in a memory array having M rows and N columns of FLASH EEPROM memory cells comprising the steps of loading a page buffer with a row of input data, selecting a row of memory cells for programming the input data to the row of memory cells, programming the row of memory cells with the input data from the page buffer, reading the row of memory cells to verify programming of the input data to the row of memory cells, and setting a program verify flag when the input data in the row of memory cells are verified. The memory array further comprises the step of reprogramming memory only cells which fail verify.

Other aspects and advantages of the present invention can be seen upon review of the figures, the detailed description, and the claims which follow.

DETAILED DESCRIPTION

Figure 1:
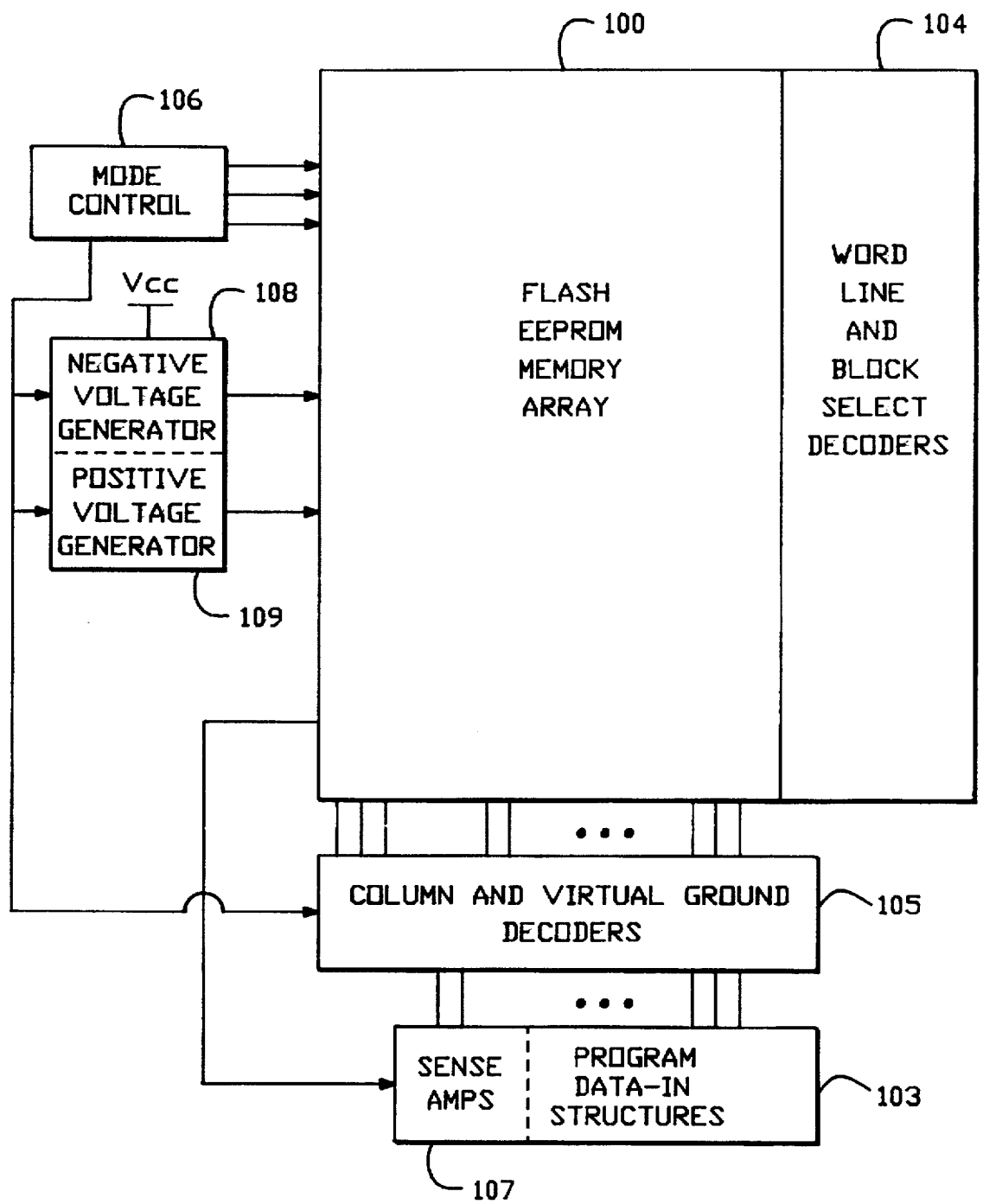
FIG. 1 is a schematic diagram of a flash EEPROM integrated circuit module according to the present invention.

A detailed description of preferred embodiments of the present invention is provided with respect to the figures, in which FIG. 1 provides a conceptual overview of a flash EEPROM integrated circuit module according to the present invention. Thus, the integrated circuit module of FIG. 1 includes a flash EEPROM memory array 100 as known in the art.

Coupled to the memory array 100 are word line and block select decoders 104 for horizontal decoding in the memory array. Also coupled to the memory array 100 are the column decoder and virtual ground circuit 105 for vertical decoding in the array.

Coupled to the column decoder and virtual ground circuit 105 are the program data in structures 103 and the sense amps 107, which provide data in and out circuitry coupled to the memory array.

The flash EEPROM integrated circuit typically is operated in a read only mode, a program mode, and an erase mode. Thus, mode control circuitry 106 is coupled to the array 100 to other blocks (108, 109, 105) on the chip.

Finally, according to one embodiment of the present invention, during the program and erase modes, a negative potential is applied to either the gate or source and drain of the memory cells. Thus, a negative voltage generator 108 and a positive voltage generator 109 are used for supplying various reference voltages to the array. The negative voltage generator 108 and positive voltage generator 109 are driven by the power supply voltage $V_{CC}$ or alternatively by $V_{CC}$ and a high program potential $V_{PP}$ as known in the art.

Figure 2:
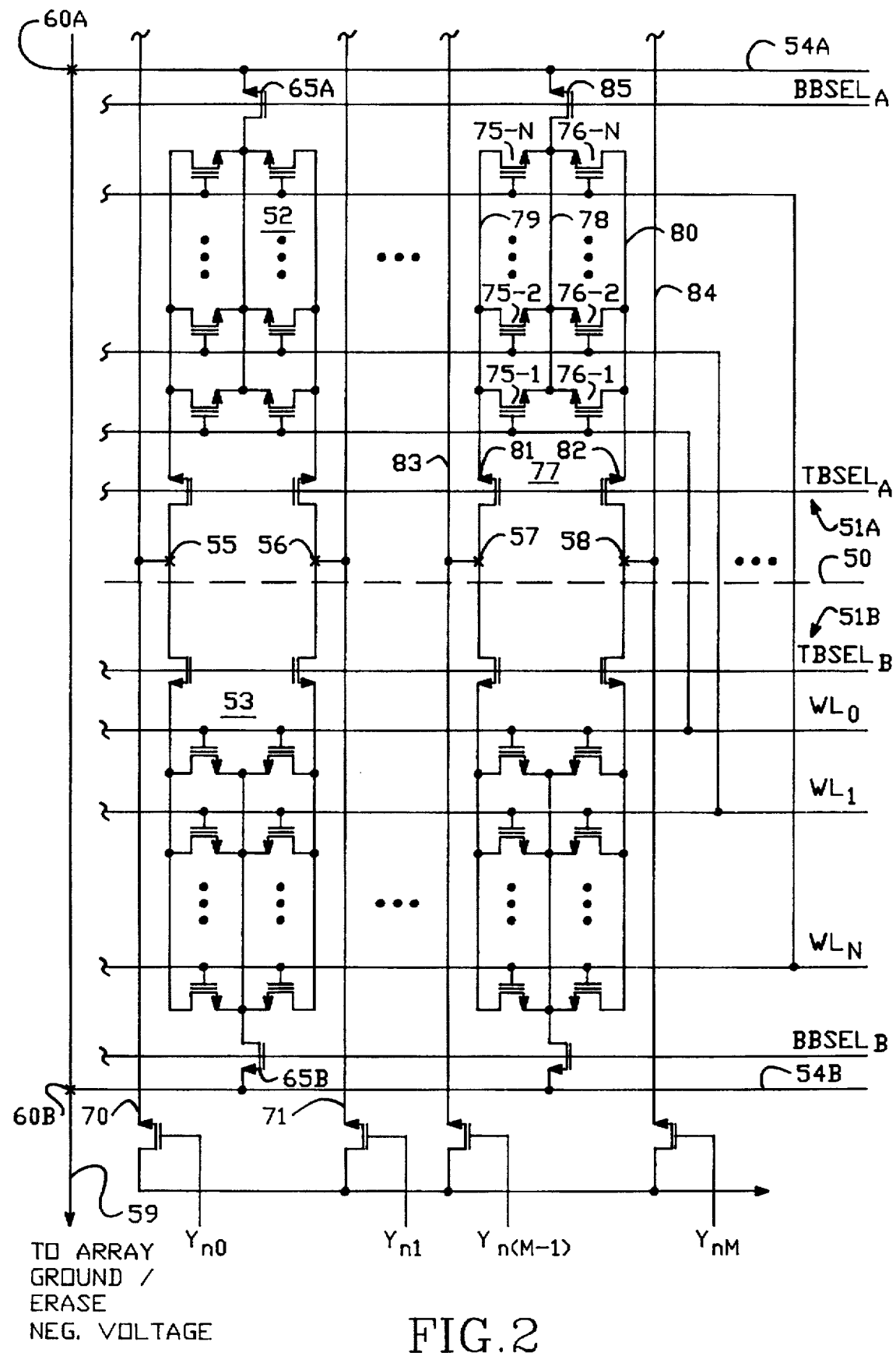
FIG. 2 is a schematic diagram of a drain-source-drain configured, virtual ground, flash EEPROM array according to one embodiment of the present invention.

FIG. 2 illustrates one example design for two segments within a larger integrated circuit. The segments are divided generally along dotted line 50 and include segment 51A generally above the dotted line 50 and segment 51B generally below the dotted line 50. A first pair 52 of columns in segment 51A is laid out in a mirror image with a second pair 53 of columns in segment 51B along a given global bit line pair (e.g., bit lines 70, 71). As one proceeds up the bit line pair, the memory segments are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 59 through metal-to-diffusion contacts 60A, 60B. The segments repeat on opposite sides of the metal virtual ground line 59 so that adjacent segments share a metal virtual ground line 59. Thus, the segment layout of FIG. 2 requires two metal contact pitches per column of two transistor cells for the global bit lines and one metal contact pitch per segment for the metal virtual ground line 59.

Each of the pairs of columns (e.g., 52, 53) along a given bit line pair comprises a set of EEPROM cells. Thus, cells 75-1, 75-2, 75-N comprise a first set of flash EEPROM cells in a first one of the pair 77 of columns. Cells 76-1, 76-2, 76-N comprise a second set of flash EEPROM cells in the second column in the pair 77 of columns.

The first set of cells and the second set of cells share a common buried diffusion source line 78. The cells 75-1, 75-2, 75-N are coupled to buried diffusion drain line 79. Cells 76-1, 76-2, 76-N are coupled to buried diffusion drain line 80. Selector circuitry comprising top select transistor 81 and top select transistor 82 couple the respective drain diffusion lines 79, 80 to metal global bit lines 83 and 84, respectively. Thus, the transistor 81 has a source coupled to the drain diffusion line 79 and a drain coupled to a metal contact 57. Transistor 82 has a source coupled to the drain diffusion line 80 and a drain coupled to the metal contact 58. The gates of transistors 81 and 82 are controlled by the signal $TBSEL_A$ to couple the respective columns of flash EEPROM cells to the global bit lines 83 and 84.

The source diffusion line 78 is coupled to the drain of select transistor 85. The source of select transistor 85 is coupled to a virtual ground diffusion line 54A. The gate of transistor 85A is controlled by the signal $BBSEL_A$.

Furthermore, a sector of two or more segments as illustrated in FIG. 2 may share word line signals because of the additional decoding provided by the top and bottom block select signals $TBSEL_A$, $TBSEL_B$, $BBSEL_A$, and $BBSEL_B$. In one embodiment, eight segments share word line drivers, providing a sector eight segments deep.

As can be seen, the architecture according to the present invention provides a sectored flash EEPROM array. This is beneficial because the source and drain of transistors in non-selected segments during a read, program or erase cycle may be isolated from the currents and voltages on the bit lines and virtual ground lines. Thus, during a read operation, sensing is improved because leakage current from segments not selected does not contribute to current on the bit lines. During the program and erase operations, the voltages of the virtual ground line, and the bit lines, are isolated from the unselected segments. This allows a sectored erase operation, either segment by segment or preferably sector by sector when the segments within a given sector share word line drivers.

Figure 3:
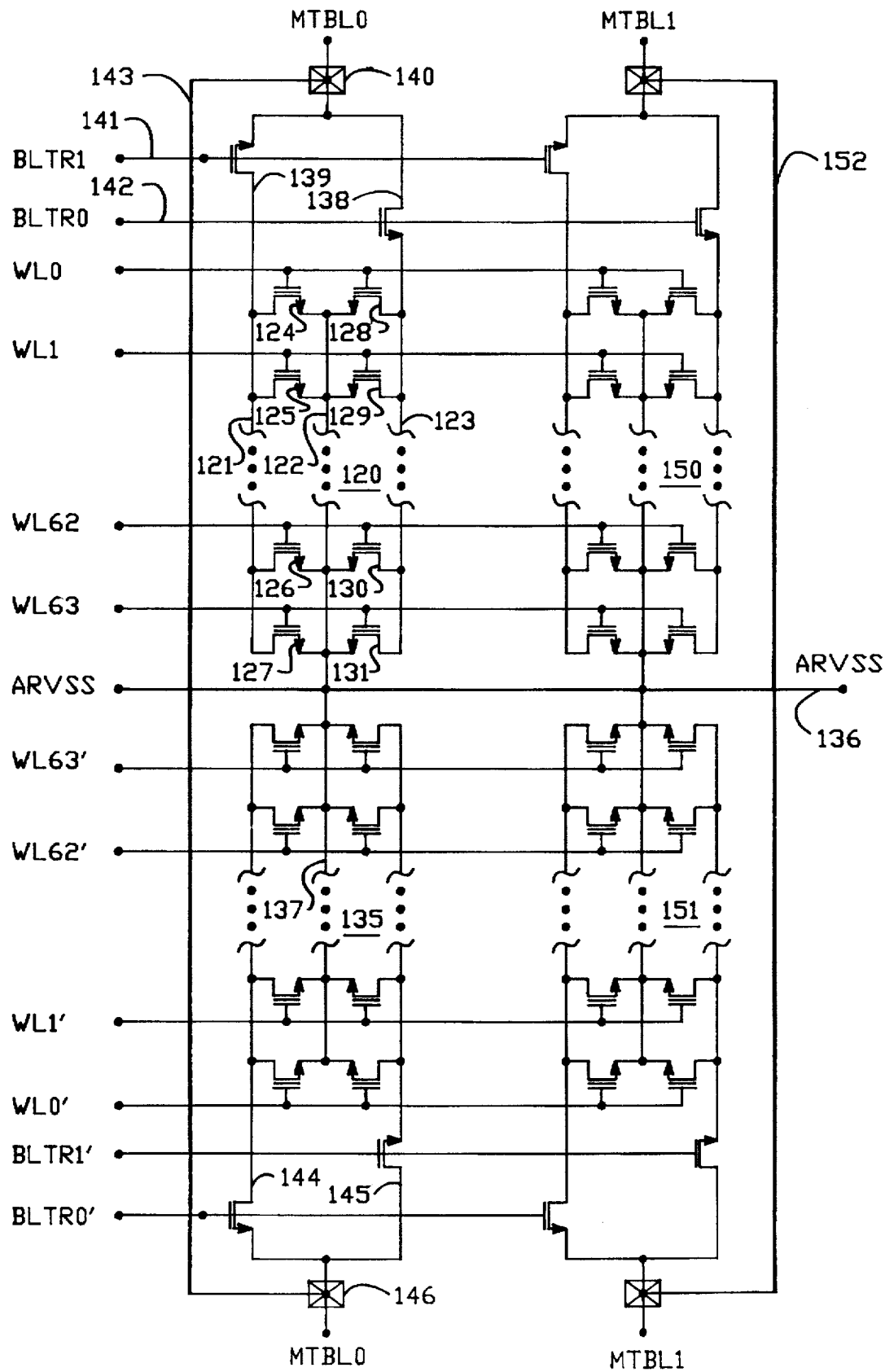
FIG. 3 is a schematic diagram of an alternative embodiment of the present invention with two columns of flash EEPROM cells sharing a single metal bit line.

It will be appreciated that the bottom block select transistors (e.g., transistors 65A, 65B) may not be necessary in a given implementation as shown in FIG. 3 below. Also, these block select transistors may share a bottom block select signal with an adjacent segment. Alternatively, the bottom block select transistors (e.g., 65A, 65B) may be replaced by single isolation transistors adjacent the virtual ground terminals 60A, 60B.

FIG. 3 illustrates an alternative architecture of the flash EEPROM array according to the present invention, in which two columns of flash EEPROM cells share a single metal bit line. FIG. 3 shows four pairs of columns of the array, where each pair of columns includes flash EEPROM cells in a drain-source-drain configuration.

Thus, the first pair 120 of columns includes a first drain diffusion line 121, a source diffusion line 122, and a second drain diffusion line 123. Word lines WL0 through WL63 each overlay the floating gates of a cell in a first one of the pairs of columns and a cell in the second one of the pairs of columns. As shown in the figure, a first pair 120 of columns includes one column including cell 124, cell 125, cell 126, and cell 127. Not shown are cells coupled to word lines WL2 through WL61. The second one of the pair 120 of columns includes cell 128, cell 129, cell 130, and cell 131. Along the same column of the array, a second pair 135 of columns is shown. It has a similar architecture to the pair 120 of columns except that it is laid out in a mirror image.

Thus, as can be seen, the transistor in the first one of the pair of columns, such as the cell 125, includes a drain in drain diffusion line 121, and a source in the source diffusion line 122. A floating gate overlays the channel region between the first drain diffusion line 121 and the source diffusion line 122. The word line WL1 overlays the floating gate of the cell 125 to establish a flash EEPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a drain in the drain diffusion line 121, a source coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cells with additional select circuitry.

The architecture shown in FIGS. 2 and 3 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, or other controls on current leakage from unselected cells. Thus, for instance, fourth and fifth diffusion lines could be added within a given isolated region to create a drain-source-drain-source-drain structure which provides four columns of cells.

Column pairs are laid out horizontally and vertically to provide an array of flash EEPROM cells comprising M word lines and 2N columns. The array requires only N metal bit lines each of which is coupled to a pair of columns of flash EEPROM cells through select circuitry, as described above.

Although the figure only shows four column pairs 120, 135, 150, and 151, coupled to two metal bit lines 143 and 152 (MTBL0–MTBL1), the array may be repeated horizontally and vertically as required to establish a large scale flash EEPROM memory array. Thus, column pairs 120 and 150 which share a word line are repeated horizontally to provide a segment of the array. Segments are repeated vertically. A group of segments (e.g., eight segments) having respective word lines coupled to a shared word line driver may be considered a sector of the array.

The layout of the array is compact because of the virtual ground configuration, the reduced metal pitch requirement for the layout, and further by the ability to share word line drivers amongst a plurality of rows in different segments. Thus, word line WL63' may share a word line driver with word line WL63. In a preferred system, eight word lines share a single word line driver. Thus, only the pitch of one word line driver circuitry is needed for each set of eight rows of cells. The additional decoding provided by the left and right select transistors (139, 138 for segment 120) allows the shared word line configuration. The shared word line configuration has the disadvantage that during a sector erase operation, eight rows of cells all receive the same word line voltage, causing a word line disturbance in cells that are not desired to be erased. If it is a problem for a given array, this disturbance problem can be eliminated by insuring that all sector erase operations decode for segments including all rows of cells coupled to the shared word line drivers. For eight word lines sharing a single driver, a minimum sector erase of eight segments may be desired.

Figure 4:
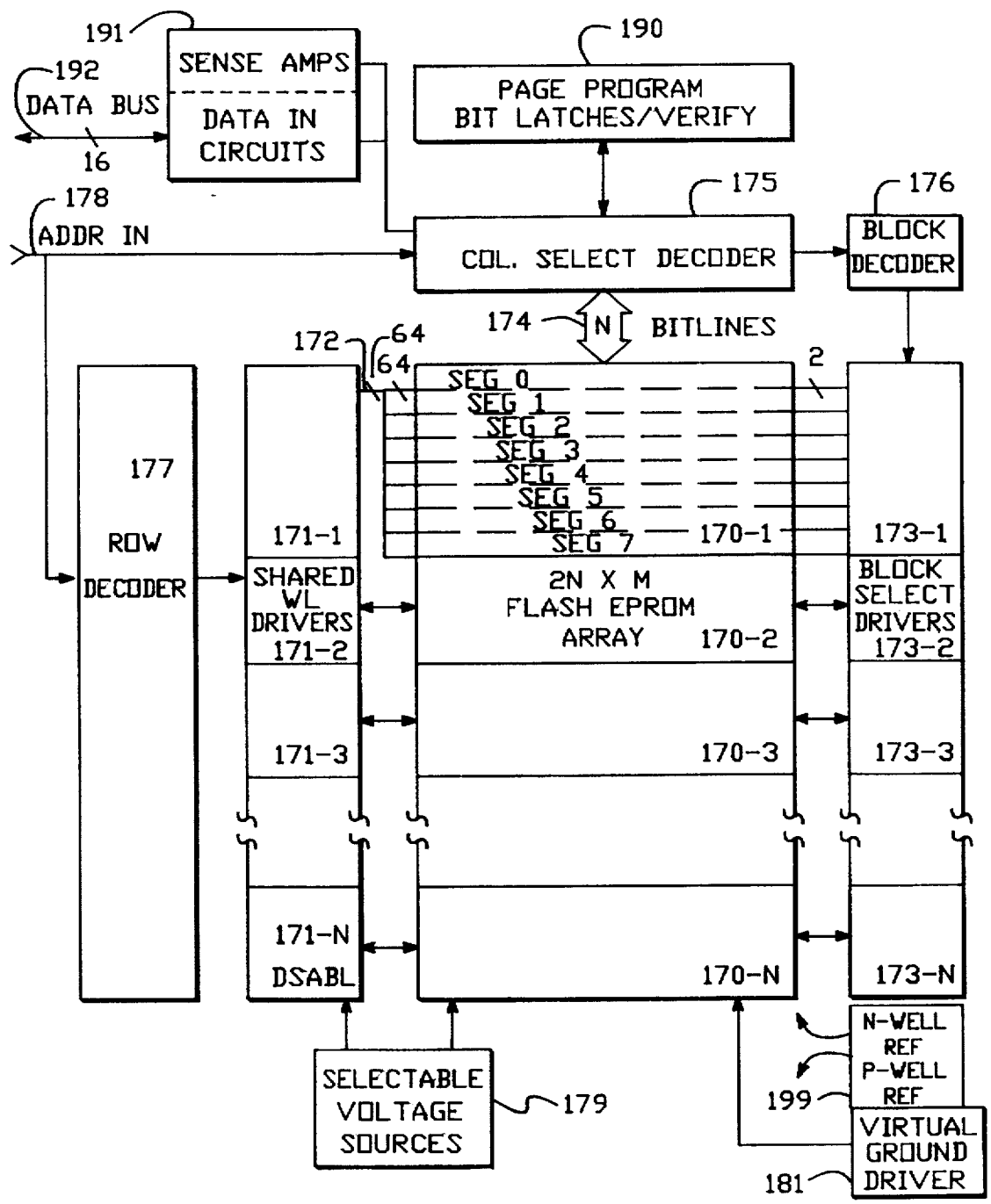
FIG. 4 is a schematic block diagram of a flash EEPROM array with page program and automatic verify according to the present invention.

FIG. 4 is a schematic block diagram of a flash EEPROM array meant to illustrate certain features of the present invention. Thus, the flash EEPROM memory module shown in FIG. 4 includes a main flash EEPROM array, including sectors 170-1, 170-2, 170-3, 170-N, each sector including eight segments (e.g., SEG0–SEG7). A plurality of sets of shared word line drivers 171-1, 171-2, 171-3, 171-N are used to drive the shared word lines of the eight segments in the respective sectors. As illustrated with respect to shared word line drivers 171-1, there are 64 shared drivers for sector 170-1. Each of the 64 drivers supplies an output on line 172. Each of these outputs is used to drive eight word lines in respective segments of the sector 170-1 as schematically illustrated in the figure by the division into eight sets of 64 lines.

Also coupled to the array are a plurality of block select drivers 173-1, 173-2, 173-3, 173-N. The block select drivers each drive a left and right block select signal for each segment. Where the segments are implemented as shown in FIG. 3, there is a BLTR1 and BLTR0 block select signal pair supplied for each set of 64 word lines.

In addition, there are N global bit lines in the flash EEPROM array. The N bit lines are used to allow access to the 2N columns of flash EEPROM cells in the array for the data in circuitry and sense amps 191. The column select decoder 175 is coupled to the page program bit latches 190, including at least one bit latch for each of the N bit lines. Also, the column select decoder 175 is coupled to the data in circuitry and sense amps 191. Data bus line 192 is 16 bits wide and provides input data to the data in circuitry and sense amps 191. Data bus line 192 also provides 16 bits of output data. Together, these circuits provide data in and out circuitry for use with the flash EEPROM array.

The N bit lines 174 are coupled to a column select decoder 175. In a preferred system, N=1024 for a total of 1024 bit lines. The block select drivers 173-1 through 173-N are coupled to a block decoder 176. The shared word line drivers 171-1 through 171-N are coupled to row decoder 177. The column select decoder 175, block decoder 176, and row decoder 177 receive address signals on the address in line 178.

Coupled to the column select decoder 175 is page program bit latches/verify block 190. The page program bit latches/verify block 190 includes N latches, one for each of the N bit lines. Thus, a page of data may be considered N bits wide, with each row of cells two pages, page 0 and page 1, wide. Pages in a given row are selected using the left and right decoding described above. The page program bit latches/verify block 190 includes verify circuitry for data stored in the N bit latches and the N bits wide page of data programmed to a selected row of cells in the array. An example of this circuitry is described below.

Selectable voltage sources 179 are used to supply the reference potentials for the read, program, and erase modes for the flash EEPROM array as conceptually illustrated in the figure, through the word line drivers 171-1 to 171-N and through the bit lines.

The virtual ground lines in the array are coupled to the virtual ground driver 181 providing potentials for the various modes to the virtual ground terminals in the array. Also, p-well and n-well reference voltage sources 199 are coupled to the respective wells of the array.

Thus, as can be seen in FIG. 4, the 64 word line drivers, such as word line drivers 171-1, are used with 512 (64×8) rows in the array. The additional decoding provided by the block select drivers (e.g., 173-1) allow for the shared word line layout.

The cells in the preferred embodiment are configured for a sector erase operation that causes charging of the floating gate (electrons entering the floating gate) such that upon sensing an erased cell, the cell is non-conducting and the output of the sense amp is high. Also, the architecture is configured for a page program which involves discharging a floating gate (electrons leaving the floating gate) such that upon sensing, a programmed cell is conducting.

The operation voltages for the programming operation are positive 6 volts to the drain of a cell to be programmed to a low (data=0) threshold condition, negative 8 volts to the gate, and 0 volts or floating of the source terminal. The substrate or the p-well of the cell is grounded. This results in a Fowler-Nordheim tunneling mechanism for discharging the floating gate.

The erase operation is executed by applying negative 8 volts to the drain, positive 12 volts to the gate, and negative 8 volts to the source. The p-well is biased at negative 8 volts. This results in a Fowler-Nordheim tunneling mechanism to charge the floating gate. The read potentials are 1.2 volts on the drain, 5 volts on the gate, and 0 volts on the source.

This sets up the ability to do a sector erase using word line decoding to select cells to be erased. The erase disturbance condition for unselected cells within a segment results in −8 volts on the drain, 0 volts on the gate, and −8 volts on the source. This is well within the tolerances of the cells to withstand these potentials without causing significant disturbance of the charge in the cell.

Similarly, the program disturbance conditions, for cells which share the same bit line in the same segment are 6 volts on the drain, 0 volts on the gate (or optionally 1 volt), and 0 volts or floating on the source. There is no gate to drain drive in this condition and it does not disturb the cell significantly.

For cells which share the same word line but not the same bit line or an addressed cell which is to remain in a high condition, the disturbance condition is 0 volts on the drain, −8 volts on the gate, and 0 volts or floating on the source. Again, this condition does not result in significant deterioration of the charge in the unselected cells.

Figure 5:
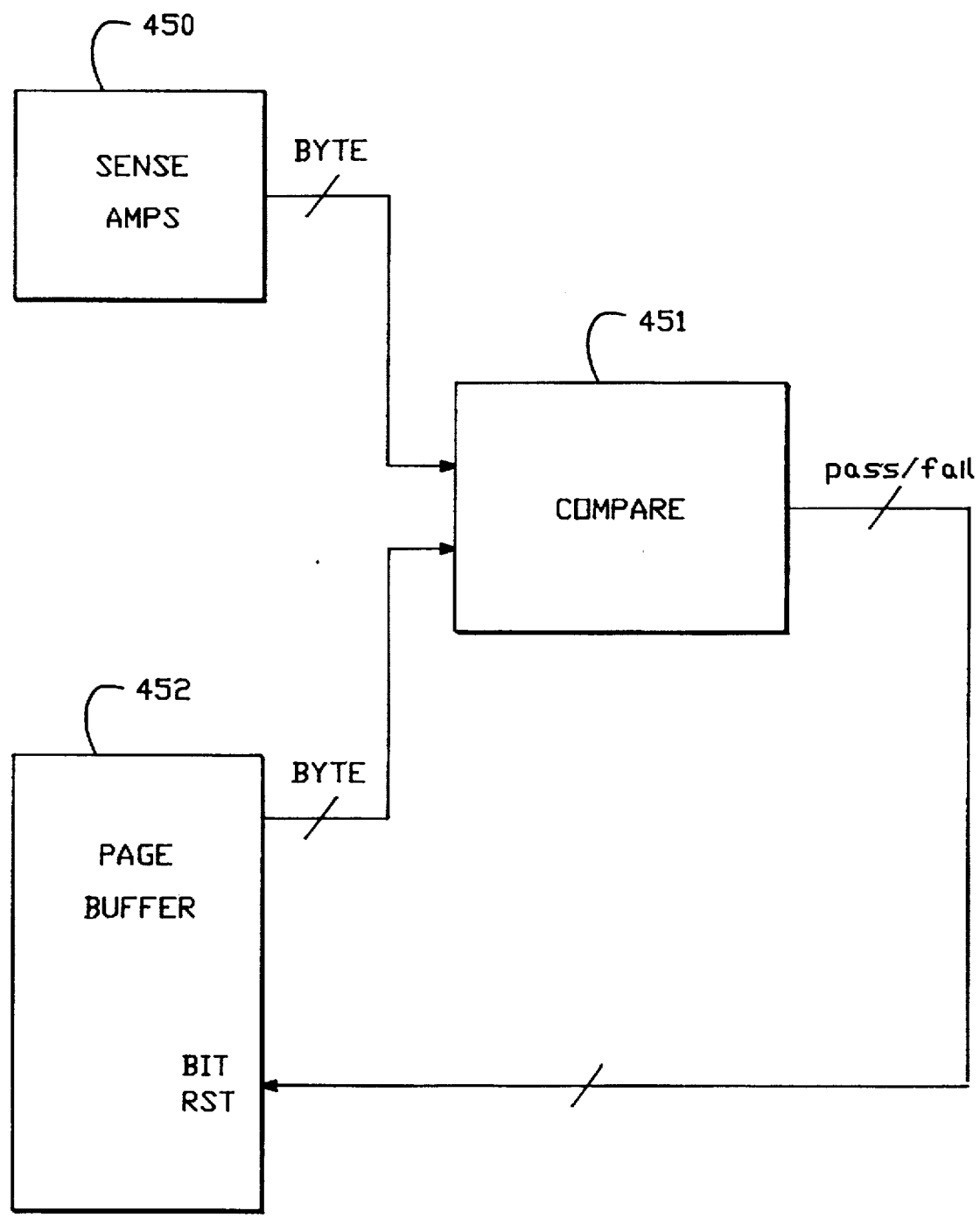
FIG. 5 is a simplified schematic showing program verify circuitry according to the present invention.

Referring to FIG. 4, the page program bit latch/verify block 190 includes program verify circuitry which involves resetting on a bit by bit basis, the data in the page buffer that passes verify. Thus, a structure such as shown in conceptual form in FIG. 5 is included in the flash EEPROM. The sense amps 450 of the array are coupled to a compare circuitry 451. The inputs to the compare circuitry are the page buffer/bit latches 452. Thus, a byte of data from the sense amps is compared against a corresponding byte from the page buffer. A pass/fail signal for the byte are fed back to a bit reset on the page buffer 452. Thus, bits which pass are reset in the page buffer. When all bits in the page buffer are reset, or a set number of retries of the program operation has been accomplished, then the program operation is complete. Actually, no compare circuitry is needed according to one aspect of the invention. Rather, the sensed data can be used directly to reset passing bit latches.

Figure 6:
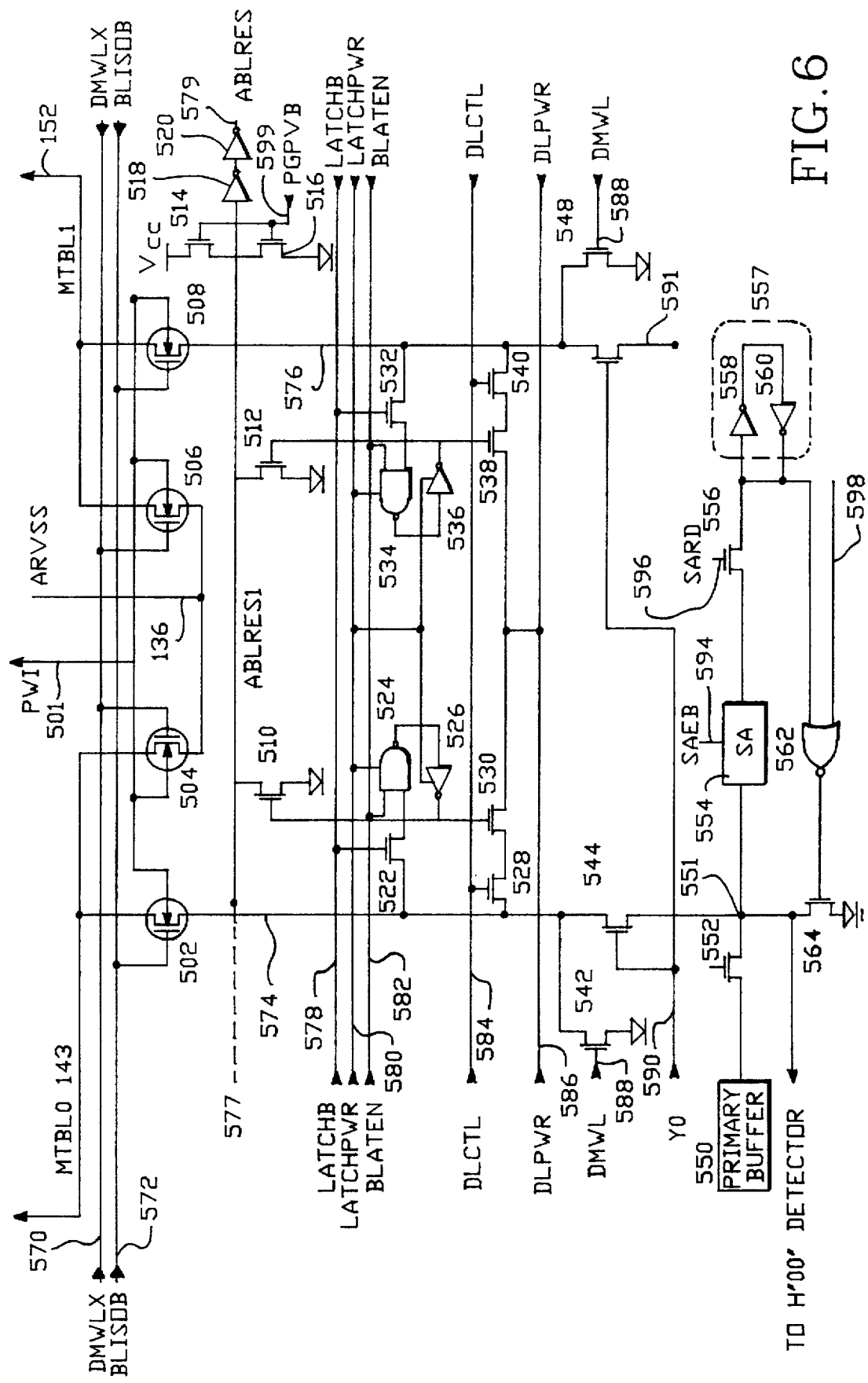
FIG. 6 is a schematic diagram showing a section of the page program and automatic verify circuit for two memory cells in the flash EEPROM array.

FIG. 6 is a schematic diagram of a section of the page program and automatic verify circuitry for two bit lines MTBL0 143 and MTBL1 152. Metal line 143 (MTBL0) of FIG. 6 corresponds to metal line 143 (MTBL0) of FIG. 3. Metal line 152 (MTBL1) corresponds to metal line 152 (MTBL1) of FIG. 3. Array virtual ground 136 (ARVSS) of FIG. 6 corresponds to the array virtual ground 136 (ARVSS) of FIG. 3. The signal PWI on line 501 is coupled to the p-well of transistors 502, 504, 506, and 508. Each pair of bitlines in the array has a similar structure coupled to it.

Referring to FIG. 6, the drain of transistor 502 and the drain of transistor 504 are coupled to the metal line 143 (MTBL0). The drain of transistor 506 and the drain of transistor 508 are coupled to the metal line 152 (MTBL1). The source of transistor of 504 and the source of transistor of 506 are coupled to the array virtual ground 136 (ARVSS). Signal DMWLX on line 570 is coupled to gate of transistor 504 and gate of transistor 506. When signal DMWLX on line 570 is active, the array virtual ground line 136 (ARVSS) is coupled to the metal line 143 (MTBL0) and the metal line 152 (MTBL1) via transistor 504 and transistor 506, respectively.

Data I/O line 574 is coupled to the source of transistor 502. Data I/O line 576 is coupled to the source of transistor 508. Signal BLISOB on line 572 is coupled to the gate transistor 502 and the gate of transistor 508. When signal BLISOB is high, metal line 143 is coupled to data I/O line 574 via transistor 502, and metal line 152 is coupled to data I/O line 576 via transistor 508.

Data I/O line 574 is coupled to the drain of transistor 542. The source of transistor 542 is coupled to ground, and the gate of transistor 542 is coupled to signal DMWL on line 588. The data I/O line 574 is pulled down when the signal DMWL is high.

Data I/O line 574 is further coupled to the drain of column select transistor 544. The source of transistor 544 is coupled to node 551. The gate of transistor 544 is coupled to signal Y0 on line 590.

A data in buffer 550 is coupled to the source of pass gate 552. The drain of pass gate 552 is coupled to node 551. Pass gate 552 is controlled by signal DINL on line 592.

Sense amp 554 is also coupled to node 551. Sense amp 554 is controlled by signal SAEB on line 594. The output of sense amp 554 is coupled to the drain of pass gate 556. The source of pass gate 556 is coupled to latch circuit 557. Pass gate 556 is controlled by signal SARD on line 596.

The latch circuit includes inverters 558 and 560. The input of inverter 558 is coupled to the source of pass gate 556. The output of inverter 558 is coupled to the input of inverter of 560, and the output of inverter 560 is coupled to the source of pass gate 556. The output of latch circuit 557 is also coupled to a first input to NOR gate 562. A second input to NOR gate 562 is coupled to signal RESLATB on line 598. The output of NOR gate 562 is coupled to the gate of transistor 564. The drain of transistor 564 is coupled to node 551, and the source is coupled to ground.

Data I/O line 576 which is coupled through transistor 508 to bit line 152 is connected in a similar manner. Thus, line 576 is coupled to the drain of transistor 548. The source of transistor 548 is coupled to ground, and the gate is coupled to signal DMWL on line 588. The drain of transistor 546 is also coupled to data I/O line 576. Signal Y0 is coupled to the gate of transistor of 546. The source of transistor 546 is coupled to node DATA1 591 which corresponds to node 551 for the other side. For simplicity, a corresponding set of DIN buffer 550, sense amp 554, latch circuit 557 and associated circuits coupled to node DATA1 591 are not shown. In operation, circuits similar to DIN buffer 550, pass gate 552, sense amp 554, pass gate 556, latch circuit 557, NOR gate 562, and transistor 564 are similarly configured and coupled to node DATA1 591.

Each data I/O line 574, 576 has a bit latch/verify logic circuit coupled to it, comprised generally of the NAND gate 524 and inverter 526 for data I/O line 574, and of NAND gate 534 and inverter 536 for data line I/O 576. For data I/O line 574, the drain of pass gate 522 is coupled to data I/O line 574, and the source of pass gate 522 is coupled to a first input of NAND gate 524. A second input to NAND gate 524 is coupled to signal BLATEN on line 582. The output of NAND gate 524 is coupled to the input of inverter 526. The input power for NAND gate 524 and inverter 526 is coupled to signal LATCHPWR on line 580. Signal LATCHB on line 578 is coupled to the gate of pass gate 522. The output of inverter 526 is coupled to the first input of NAND gate 524, the gate of transistor 510, and the gate of transistor 530. The drain of transistor 510 is coupled to signal ABLRES1 on line 577. The source of transistor 510 is coupled to ground. The drain of transistor 530 is coupled to signal DLPWR on line 586. The source of transistor 530 is coupled to the drain of transistor 528. The gate of transistor 528 is coupled to signal DLCTL on line 584, and the source of transistor 528 is coupled to data I/O line 574.

The data=1 state latched in latch circuitry 524 and 526 pulls down signal ABLRES on line 577. The logic high level enables transistor 510 which causes a logic low level on line 577. When transistor 510 is enabled, line 577 is coupled to ground which causes signal ABLRES to a logic low level. Transistors 514 and 516 comprise an inverter, which, together with transistors 510 and 512, provides a NOR logic function. Transistor 514 is a p-channel transistor with the source coupled to Vcc and the drain coupled to the drain of n-channel transistor 516. Line 577 is coupled to the drains of transistors 514 and 516. The source of n-channel transistor 516 is coupled to ground, and the gates of transistors 514 and 516 are coupled to signal PGPVB on line 599. Inverters 518 and 520 are coupled in series. Line 577 provides the input to inverter 518. The output of inverter 518 provides the input of inverter 520, and the output of inverter 520 provides signal ABLRES on line 579. Thus, whenever latch circuitry 524 and 526 stores a logic high level, signal ABLRES is a logic low level. Transistor 514 provides a pull-up to line 577 which can be driven to a logic low level by enabling either transistor 510 or transistor 512.

The purpose of transistor 516 is that during default state PGFVB on line 599 is "HIGH", and all the gates of transistors 510, 512 . . . are low, so that if there is no transistor 516, ABLRES1 on line 577 is floating. Transistor 516 is added to help line 577 to pull low in this case. During active mode, which is program-verify period during page program mode, PGPVB on line 599 is active "LOW", transistor 516 is off and transistor 514 provides a pull-up to line 577.

A mirrored arrangement of circuits also controlled by signals LATCHB, LATCHPWR, BLATEN and DLCTL and are coupled to data I/O line 576. The drain of pass gate of 532 is coupled to data I/O line 576. The gate of pass gate 532 is coupled to signal LATCHB on line 578. The source of pass gate 532 is coupled to a first input to NAND gate 534. A second input to NAND gate 534 is coupled to signal BLATEN on line 582. The output of NAND gate 534 is coupled to the input of inverter 536. Signal LATCHPWR on line 580 provides input power to NAND gate 534 and inverter 536. The output of inverter of 536 is coupled to the first input of NAND gate 534, the gate of transistor of 512, and the gate of transistor 538. Signal DLPWR on line 586 is coupled to the drain of transistor 538. The source of transistor 538 is coupled to the drain of transistor 540. The gate of transistor of 540 is coupled to signal DLCTL on line 584, and the source of transistor 540 is coupled to data I/O line 576. The source of transistor 512 is coupled to ground and the drain of transistor 512 is coupled to line 577.

Figure 7:
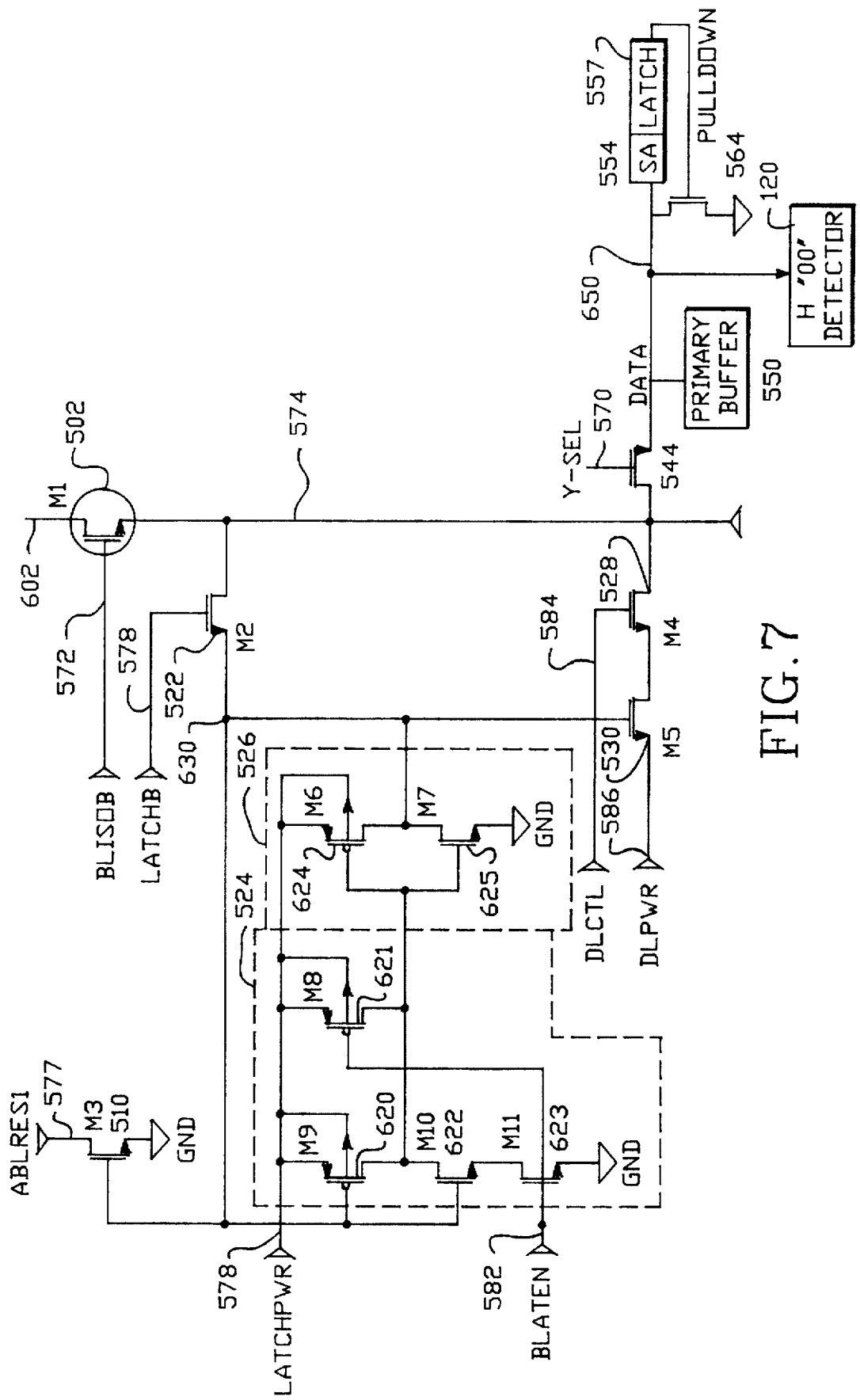
FIG. 7 is a simplified circuit diagram of the page program and automatic verify circuit for a memory cell in the flash EEPROM array.

FIG. 7 is a circuit diagram of a single bit latch for a bit line 602 in the memory array, such as a line corresponding to the metal line 143 (MTBL0) of FIG. 6. As in FIG. 6, the drain of transistor 502 is coupled to line 602. The source of transistor 502 is coupled to data I/O line 574. The gate of transistor 502 is coupled to signal BLISOB on line 572. The width of transistor 502 is 20 microns, and the length of transistor 502 is 1.2 microns. The drain of transistor 522 is coupled to data I/O line 574, and the source of transistor 522 is coupled to a first input of NAND gate 524. Signal LATCHB on line 578 is coupled to the gate of transistor 522. The width of transistor 522 is 6 microns, and the length of transistor 522 is 1.2 microns.

Transistors 620, 621, 622, and 623 comprise NAND gate 524. Transistor 624 and 625 comprise inverter 526. Signal LATCHPWR on line 578 provides power to NAND gate 524 and inverter 526. For example, the source of p-channel transistor 620, the source of p-channel transistor 621, and the source of p-channel transistor 624 are coupled to signal LATCHPWR on line 578. The substrates of transistor 620, transistor 621, and transistor 624 are also coupled to LATCHPWR on line 578. The gate of transistor 620 is coupled to node 630 providing the first input of NAND gate 524. The gate of transistor 622 is further coupled to node 630. The drain of transistor 622 and the drain of transistor 621 are coupled to the drain of transistor 620. The gate of transistor 621 and the gate of transistor 623 are coupled to signal BLATEN on line 582. Signal BLATEN on line 582 provides a second input to NAND gate 524. The drain of transistor 623 is coupled to the source of transistor 622, and the source of transistor 623 is coupled to ground.

The drain of transistor 621 provides the output of NAND gate 524 and is coupled to the input of inverter 526. The gate of transistor 624 and the gate of transistor 625 provide the input to inverter 526. The source of transistor 624 is coupled to signal LATCHPWR on line 578 to provide power to inverter 526. The drains of transistor 624 and transistor 625 are coupled to node 630 and provide the output to inverter 526. The source of transistor 625 is coupled to ground. The substrate of transistor 624 is coupled to signal LATCHPWR on line 578.

Transistors 621 and 624 have a width of 3 microns and a length of 1.4 microns. Transistor 620 has a length of 1.6 microns and a width of 3 microns. Transistor 622 and transistor 623 have a width of 3 microns and a length of 1.2 microns. Transistor 625 has a width of 3 microns and a length of 2 microns.

The output of latch circuitry 524 and 526 is coupled to the gate of transistor 530 and the source of transistor 522. Signal DLPWR on line 586 is coupled to the source of transistor 530. The drain of transistor 530 is coupled to the source of transistor 528. The gate of transistor 528 is coupled to signal DLCTL on line 584. The drain of transistor 528 is coupled to data I/O line 574. Transistor 530 and transistor 528 have a width of 6 microns and a length of 1.2 microns.

The drain of transistor 510 provides output signal ABL-RES1 on line 577. The source of transistor 510 is coupled to ground, and the gate of transistor 510 is coupled to node 630. Thus, depending on the state of the bit latch, signal ABL-RES1 is either shorted to ground or pulled up by transmitter 514. The width of transistor 510 is 3 microns and the length is 0.8 microns.

The drain of transistor 544 is coupled to data I/O line 574, and the source is coupled to data line 650. Signal YSEL on line 590 is coupled to the gate of transistor 544 on line 590. DIN buffer 550 is coupled to data line 650. Sense amp 554 is coupled to data line 650 and provides a control signal to the gate of transistor 564. The drain of transistor 564 is coupled to data line 650, and the source of transistor 564 is coupled to ground. Thus, depending on the output of sense amp 554, transistor 564 couples data line 650 to ground.

In operation, the page program and automatic verify circuit of the flash EEPROM array as shown in FIGS. 6 and 7 executes the page program and program verify in a series of stages. The stages can be generalized as a (1) data loading stage; (2) data program stage; (3) read the array data stage; (4) reset bit latch stage; and (5) retry stage. The operation of the page program and automatic verify of the flash EEPROM array is described with reference to data I/O line 574. Page program and automatic verify are similarly performed using data I/O line 576 that is coupled to another memory cell. Furthermore, the page program and automatic verify circuit includes similar circuitry for all data I/O lines needed to program a page of memory cells in the flash EEPROM array.

In the data loading stage, signal LATCHPWR on line 580, signal LATCHB on line 578, and signal BLATEN on line 582 are supplied with 5 volts to activate data latch circuitry 524 and 526 for operation. Signal LATCHPWR on line 580 supplies voltage to NAND gate 524 and inverter 526 for operation. Signal BLATEN on line 582 enables latch circuitry 524 and 526 to receive inputs. Signal LATCHB on line 578 enables pass gate 522 to couple data I/O line 574 with the first input of NAND gate 524. Signal BLISOB on line 572 is at a logic low level which disables transistor 502. Disabling transistor 502 isolates data I/O line 574 from the metal line 143 (MTBL0). Signal DLCTL on line 584 is at a logic low level which disables pass gate 528. Signal DLPWR is at a logic high level having a voltage of Vcc that is approximately 5 volts. Signal DMWL on line 588 is at a logic low which prevents transistor 542 from coupling data I/O line 574 to ground. Signal Y0 on line 590 is a logic high level which enables transistor 544 to conduct. Signal Y0 is a decoded signal which enables data I/O line 574 to access a corresponding one of 16 DIN buffers (e.g. buffer 550) during the data loading stage. Signal DINL on line 592 is a logic high which enable pass gate 552. Input data from DIN buffers 550 is transferred via pass gate 552 to data I/O line 574.

Once input data is transferred to data I/O line 574, the data from DIN buffer 550 is transferred to the first input of NAND gate 524. If data from DIN buffer 550 is a logic high level, the logic high level received at the first input of NAND gate 524 causes a logic low output. The logic low output of NAND gate 524 provides the input to inverter 526 which provides a logic high output. NAND gate 524 and inverter 526 comprise the bit latch circuitry 524 and 526 which latches the data received at the first input of NAND gate 524. The logic high level at the output of inverter 526 enables pass gate 530 and transfers signal DLPWR on line 586 to pass gate 528. However, during the data loading stage, signal DLCTL on line 584 is a logic low which disables pass gate 528 from conducting signal DLPWR to data I/O line 574.

In the other case, when data from DIN buffer 550 is a logic low level, the logic low level received at the first input of NAND gate 524 causes a logic high output. The logic high output of NAND gate 524 provides the input to inverter 526 which provides a logic low output that is stored in latch circuitry 524 and 526. The logic low at the output of inverter 526 disables pass gate 530 and the transfer of signal DLPWR on line 586 via pass gate 528 to data I/O line 574. Thus, the bit latch circuit of NAND gate 524 and inverter 526 stores either the logic high level or the logic low level of the input data which corresponds to the data transferred from DIN buffer 550.

The bit latches for the entire page of 1024 bits are loaded 16 bits at a time. Once the input data from DIN buffers 550 is loaded into bit latch circuitry 524 and 526 after execution of the data loading stage for all bit lines, a verify sequence is executed followed by the data write stage. The pre-writing verify loop (according to the sequence described below) prevents over programming cells into depletion such as if a user programs the page with the same data twice. A data write occurs when a logic high is stored in the latch circuitry 524 and 526. When a logic high level data=1 state is received from DIN buffer 550, the logic high level is programmed to a cell of the flash EEPROM array during the data write stage. If a logic low level (data=0) is received from DIN buffer 550 and stored in latch circuitry 524 and 526, the data write stage does not program the memory cell of the flash EEPROM.

In the present example, a logic high level (data=1) is transferred from DIN buffer 550 and stored in bit latch circuitry 524 and 526. During the execution of the data write stage, signal LATCHB on line 578 is disabled. Signal LATCHB on line 578 is set to a logic low to disable inputs to latch circuitry 524 and 526. Signal LATCHPWR is set to a high voltage to provide power to latch circuitry 524 and 526. Signal BLATEN on line 582 is set to a high voltage level to enable the output of latch circuitry 524 and 526. Signal BLISOB on line 572 is set to a high voltage level to enable transistor 502. Transistor 502 couples data I/O line 574 to metal line 143. Signal DLCTL on line 584 is set to a high voltage level to enable pass gate 528. Signal DLPWR on line 586 is set to a high voltage. Signal Y0 on line 590 is a logic low level to disable transistor 544. Signal DINL is a logic low level which decouples input data from DIN buffer 550 from data I/O line 574. Signal SAEB is a logic low level to disable sense amp 554.

Once the control signals are properly initialized to perform the data program stage, signal DLPWR on line 586 is transferred to data I/O line 574. Signal DLPWR provides programming power to program a memory cell in the flash EEPROM array. Thus, if latch circuitry 524 and 526 is latched with a data=1 state, pass gate 530 is enabled to permit signal DLPWR to pass through pass gate 528. Signal BLISOB on line 572 enables transistor 502 and couples signal DLPWR to the metal line 143 (MTBL0).

Referring to FIG. 3, enabling signal BLTR1 on line 141 or BLTR0 on line 142 couples a column of cells to the metal line 143 and provides the programming voltage from signal DLPWR to program a particular memory cell 125 or 129 on the word line which is changed to −8 volts. For instance, if BLTR1 on line 141 is selected and word line WL1 is selected, the programming voltage from signal DLPWR is directed to memory cell 125.

After the data from latch circuitry 524 and 526 is programmed to the memory cell, the circuitry is ready to verify automatically that the data was properly programmed in the data write stage. This involves a five step sequence (A through E; see FIG. 8 for timing diagram) for deciding whether to reset the bit latch as follows:

Step A

READ the real data from the non-volatile bit through the associated sense amp (all 16 sense amps are activated at the same time, i.e. 16 bits are read at the same time). The sensing result is stored in latch 557 of FIG. 6. For example, in FIG. 6, to verify a selected cell from a specified wordline, BLISOB (572) must be high (ON), selected Y (544, 546 and 14 more of such devices) is on, sense amp (SA) 554 is activated (and 15 other SA), SARD (596) is high to allow the sensing result pass to the latch (557) and LATCHB (578), DLCTL (584) are at low voltage (OFF) so that during this READ step, the bit latch consisting of 524 and 526 will not be disturbed. The selected cell threshold voltage is sensed by the SA (554) via data line 574 and then stored in latch 557, after a certain amount of time which is long enough for the SA (554) to do the sensing. If after programming, the cell's threshold voltage (VT) is low enough (to the point that the SA 554 can tell that the cell is at low VT state) then the output of the inverter (560, or input of 558) will reflect a low level, SARD (596) is off and then SA (544) is disabled. The low level is stored in latch (557), no matter what read happens during the next 4 steps in sequence until the new locations need to be read again. If after programming, the selected cell VT is still read high, then the output of inverter 560 is at high level, i.e. a logic high level is latched in latch 557. Note that RESLATB (598) is HIGH in this step so that whether latch 557 latched high or low will not affect device (564) because device 564 is OFF anyway.

Step B

Figure 8:
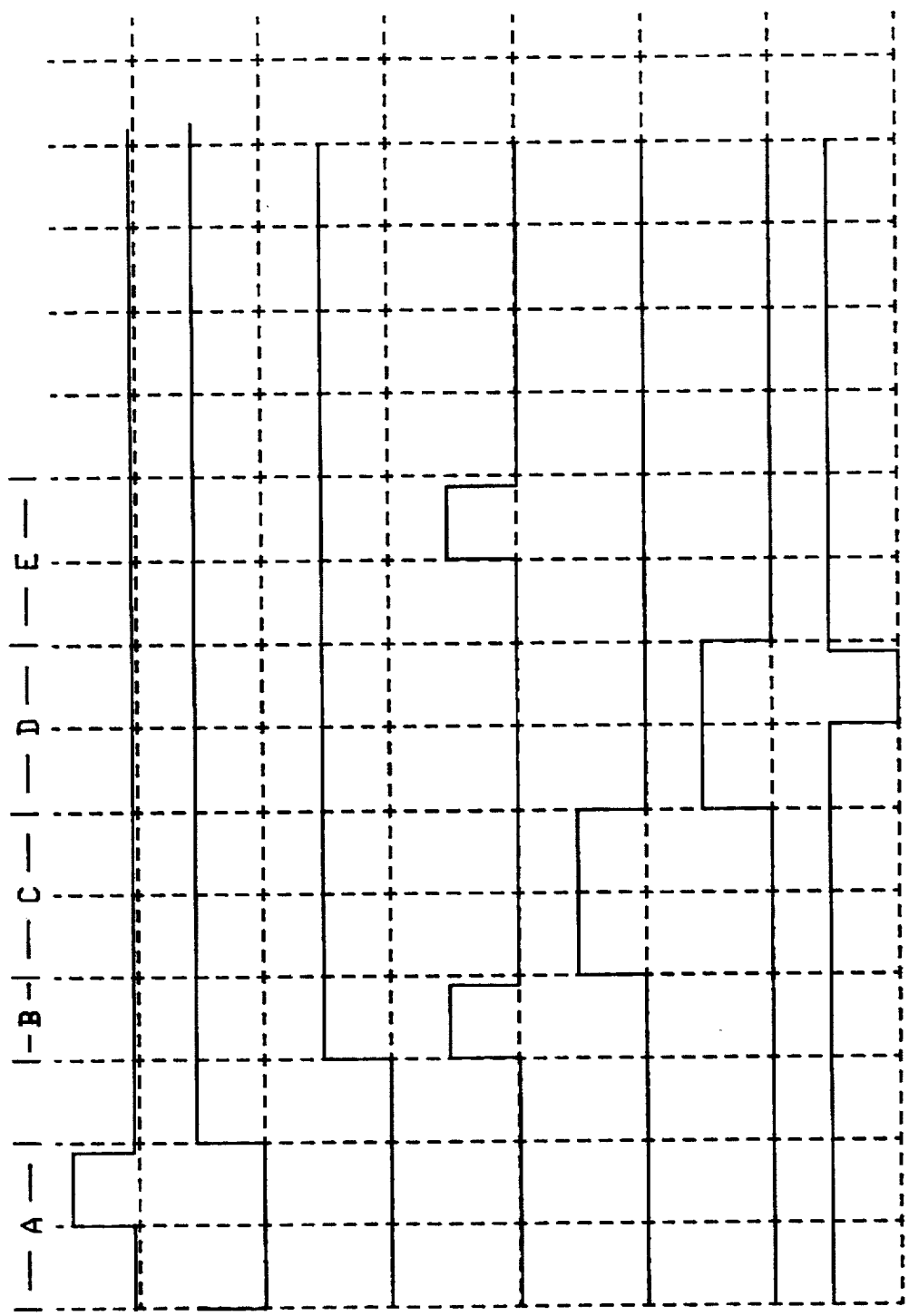
FIG. 8 is a timing diagram for control signals in the automatic verify circuitry of FIGS. 6 and 7.

DISCHARGE DATA LINES (all including selected and deselected) The purpose of this step will be explained in STEP D). The way of discharging the data line 574 is by activating DMWL (588) to high, LATCHB at low, DLCTL at low, with all sense amps disabled, 564 and 552 are off. Transistor 588 discharges charge stored in data line 574. BLISOB (572) is at low level (BLISO of FIG. 8 is high) to isolate the long metal-bit-line (MTBL0) from the data line (574) so that the discharge sequence can be achieved faster.

Step C

PRE-CHARGE DATA LINES (selectively, according to the associated bit latch) The purpose of this step will be explained in step D.) During this step, DMWL is at low level, BLISOB is still at low level (BLISO of FIG. 8 is high), whether the selected 16 data lines of the same word and other de-selected data lines should be precharged to a high voltage level or not is decided by the data which is stored in the bit latch. For example, in FIG. 6, during this step LATCHB (578) is still off, DLCTL (584) is switched from low to high, and data line 574 is precharged to a high level by connecting DLPWR (a $V_{CC}$ level power source for this instance) to the data line (574) via devices 530 and 528 if the output of inverter 526 (which is the gate of 530) is latched at HIGH level. Otherwise DLPWR cannot precharge data line 574 to a high level and the data line 574 should be still at a low voltage level due to step B)

Step D

RESET BIT LATCH OR NOT? During this step LATCHB (578) is switched from low level to a high level, and RESLATB (598) switches from high to low in order to reset bit latch (which consists of inverter 524 and 526) by turning on 564, if the output of inverter 560 is (latched) low (from step A). Since the selected cell is at low VT already, the bit latch content shall be reset so that for the next programming, high voltage pulse sequence, the cell which is at low VT shall not be programmed to low VT again. There is a chance that the bit latch had been reset from a previous verify loop step D) or was at reset state even before the first programming sequence. In these cases, the subsequent reset bit latch step is of no effect to the bit latch for the former case; and for the latter case whether the selected cell is at high VT or not will not affect the bit latch because that if the cell is at high VT, there is no resetting the bit latch (564 is OFF, from Steps A and D) and bit latch was at reset state. If the cell was at low VT, then resetting the bit latch again makes no difference to the contents of the bit latch. There is no comparison circuit needed in this implementation.

Note that LATCHB is a global signal to all the bit latches in the FLASH EEPROM design and the high level at the gates of 522, 532 . . . results in all bit latches talking to the associated data lines which means that the node of the output of inverter 526 will encounter a charge sharing with the associated data line (574, for example). The driving capability of inverter 526 is designed to be a weak device in order that a proper data can be set (to fight against inverter 526) into the bit latch. So when LATCHB (528) is HIGH, weak inverter (526) suffers a charge sharing issues which results in the uncertainty of the integrity of the bit latch.

The purpose of steps B) and C) is to put the proper voltage level at the data lines before getting into step D), i.e. before LATCHB (578) switches from low to high to avoid any "charge sharing issues", even though the circuitry can be designed as mentioned above to ensure proper operation without them. During step B), all data lines are discharged to low level and then at step C) only those data lines whose associated bit latches "stored" high level will be precharged to a high level. Thus steps B) and C) are optional steps inserted here for safety in the design.

Step E

DISCHARGE ALL DATA LINES AGAIN. At this moment, the program-verify activity is pretty much done, before moving into the next word for programming-verifying (or more precisely, to change the new word and repeat from step A) to step D)), the logic control will remove residue charges from all the data lines and switch to new word. For example, during this step, LATCHB (578) is at LOW level, RESLATB (598) is at HIGH level, DMWL (598) is at HIGH level and BLISOB (572) is at HIGH level (BLISO of FIG. 8 is low).

Thus, the page program and automatic verify circuit of FIG. 5 provides the unique feature of automatically verifying a memory cell that is programmed. Latch circuitry 524 and 526 stores the input data received from DIN buffer 550. The stored data in latch circuitry 524 and 526 controls ABLRES1 which is set to a logic low level if there is one or more than one of the cells which need to be programmed. Signal ABLRES1 remains a logic low level until the memory cell is verified during the program verify sequence which resets latch circuitry 524 and 526 to a logic low level and resets signal ABLRES1 to a logic high level indicating a properly programmed memory cell. The program verify sequence is automatic.

Signal PGPVB on line 599 is a logic low level to supply a charge to line 577 during automatic verify sequence. When latch circuitry 526 and 524 is reset, transistor 510 is disabled and the charge on line 577 is no longer discharged to ground. Signal ABLRES1 on line 577 becomes a logic high level. The logic high level provides an input to inverter 518 which produces an output that provides an input to inverter 520 which provides the logic high level output of signal ABLRES on line 579. The logic high level of signal ABLRES on line 579 provides a page programmed verify signal signifying the page of memory cells has passed program verify.

Each memory cell within a page of memory cells in the array is able to activate a transistor 510 to cause signal ABLRES1 on line 577 to a low level. Thus, any memory cell that does not pass program verify within a page of memory cells in the array can cause the output ABLRES to be a logic low level. The logic low level of ABLRES on line 579 signals that at least one memory cell within the page of memory cells in the array is not properly programmed and verified. Thus, any memory cell not properly verified can cause signal ABLRES on line 579 to be a logic low level. When all memory cells are properly programmed and verified, signal ABLRES on line 579 is a logic high level.

In operation, unsuccessfully programmed memory cells are reprogrammed and reverified until signal ABLRES becomes a logic high level. The number of retries are limited to prevent looping of the programming sequence if a page repeatedly fails program verification.

Figure 9A:
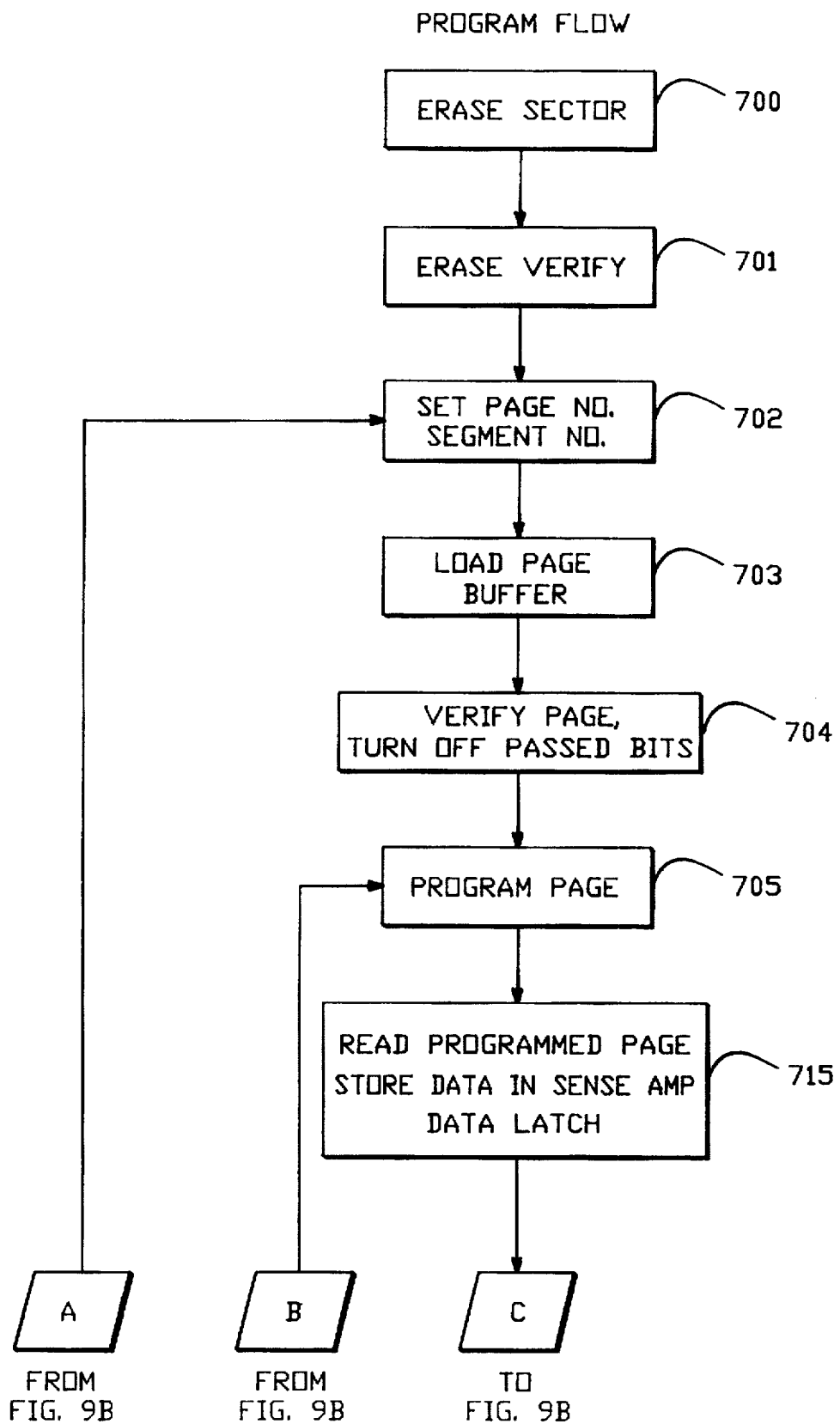
FIGS. 9A–9B illustrate a flow chart of a page program and automatic verify operation according to the present invention.
Figure 9B:
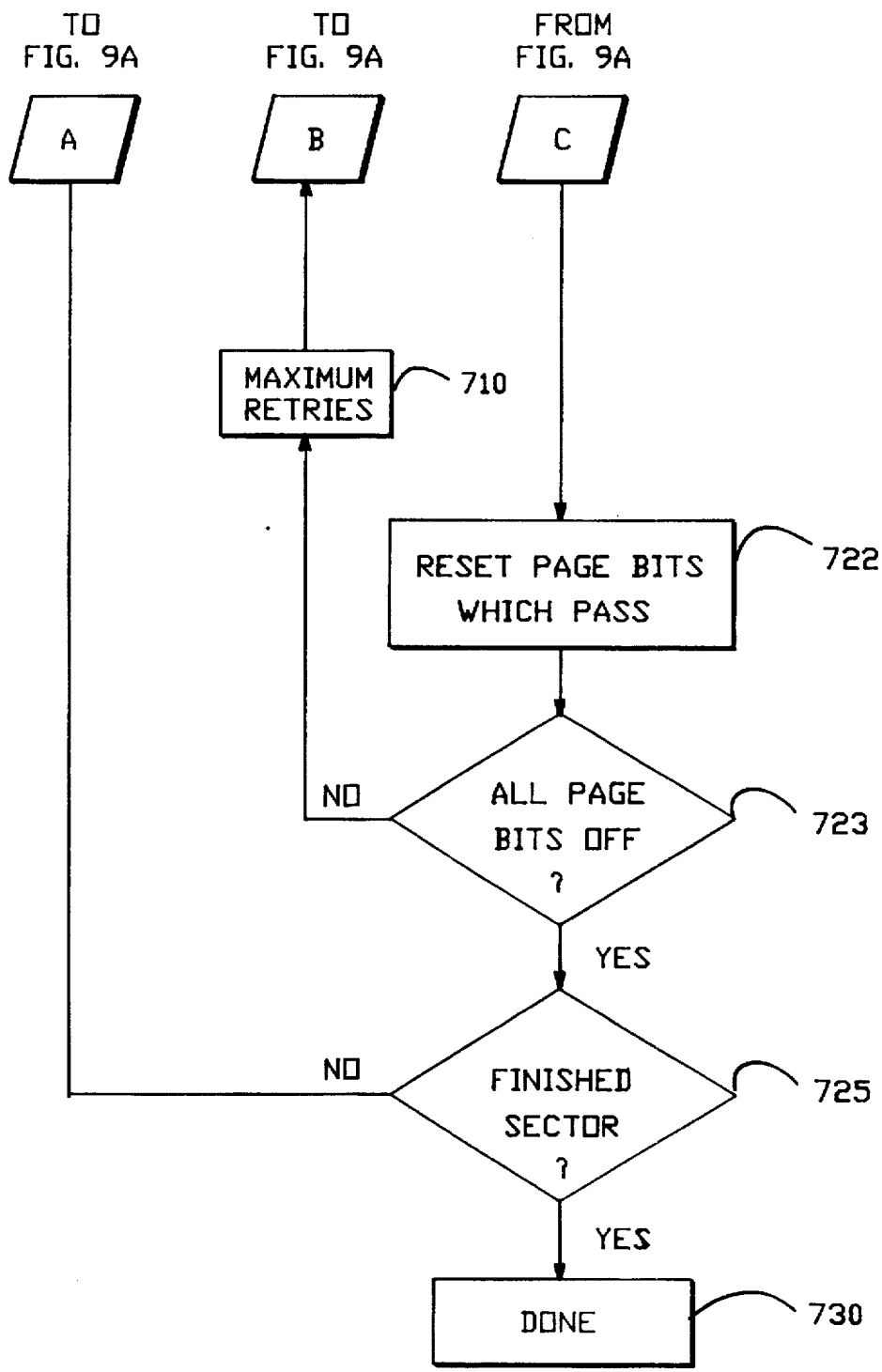

FIGS. 9A–9B provide a flow chart illustrating the program flow for the flash EEPROM circuit of FIG. 6. The process begins by erasing the sector (e.g., sector 170-1) into which data is to be programmed (block 700). After erasing the sector, an erase verify operation is executed (block 701). Next, the page number, either 0 or 1, and the segment number, 1-8, is set by the host processor in response to the input address (block 702).

After setting the page number and segment number, the page buffer is loaded with the data for the page (block 703). This page buffer may be loaded with an entire N bits of data, or a single byte of data, as suits a particular program operation. Next, a verify operation is executed, in case the user does not pre-erase or tries to reprogram the same data, to determine which cells need programming (block 704). After loading the page buffer, the program potentials are applied to the segment being programmed (block 705). After the program page operation, a verify operation is executed in which the page is verified. In the verify operation, the programmed page is read and each corresponding read bit of data is stored in a sense amp data latch (block 715).

Referring to FIG. 9B, the page bits which pass verify are reset (block 722). Next, the algorithm determines whether all page bits are turned off in the page buffer (block 723). If they are not all off, then the algorithm determines whether a maximum number of retries has been made (block 710), and if not, loops to block 705 to program the page again, such that the failed bits are reprogrammed. The bits which pass are not reprogrammed because the corresponding bits in the page buffer were reset to 0 during the verify operation. If the maximum number of retries has been made at block 710, then the algorithm hangs up, signaling an unsuccessful operation.

If at block 723, all page bits were off, then the algorithm determines whether the sector has been finished, that is, whether both pages of the sector are to be written and both are completed (block 725). This is a CPU determined parameter. If the sector is not finished, then the algorithm loops to block 702 and updates the appropriate one of the page number or segment number. If the sector has been finished at block 725, then the algorithm is done (block 730).

Accordingly, a new flash EEPROM cell and array architecture have been provided. The architecture provides for a very dense core array obtained by unique cell layouts, where two adjacent local drain bit lines share one common source bit line. Also, the layout has been optimized to allow use of a single metal line for every two columns of cells in the array. Further, the layout is further reduced by shared word lines, so that the word line driver pitch does not impact the size of the main array. Sector erase is feasible using segmentable architecture of the present invention. Also, the page program and automatic verify circuitry provides efficient and accurate programming of the memory cells. Thus, a high performance, reliable flash memory array can be achieved using these technologies.

An n-channel embodiment of the flash EEPROM array has been disclosed. Those skilled in the art will recognize that p-channel equivalent circuits can be implemented using techniques known in the art.

Furthermore, the architecture has been designed with respect to flash EEPROM cells. Many aspects of the architecture may be adapted to a variety of memory circuit arrays.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An apparatus for storing data, comprising:
   a memory array having a plurality of floating gate cells;
   supply circuits, coupled to the memory array, which apply voltages to the plurality of floating gate cells to read and program the plurality of floating gate cells in the memory array;

a plurality of bit latches, coupled to the memory array, which provide a buffer for storage of data to a set including at least a portion of a row of floating gate cells in the memory array;

control logic, coupled to the supply circuits and the bit latches, which controls the supply circuits to program the data in the plurality of bit latches to the set of floating gate cells; and automatic data verify circuits, coupled to the memory array and the plurality of bit latches, which verify successful programming of the data to the set of floating gate cells in the memory array and provide a data verified signal when the row of plurality of floating gate cells pass data verify, the automatic data verify circuits including verify logic, coupled to the bit latches and floating gate cells in the memory array, which reads the memory data from the floating gate cells and resets the corresponding bit latches when the read data indicates a programmed state.

2. The apparatus of claim 1, wherein:

each row of plurality of floating gate cells includes a first page and second page; and the set includes a page of floating gate cells.

3. The apparatus of claim 1, wherein:

the memory array includes at least M word lines and N bit lines coupled to the plurality of floating gate cells; and the plurality of bit latches includes one bit latch for each of the N bit lines;

and N is greater than 32.

4. The apparatus of claim 1, wherein the data verify circuits include output logic, coupled to the verify logic of each floating gate cell being verified, which provides the data verified signal when all bit latches store a particular binary value.

5. The apparatus of claim 4, further comprising retry logic, coupled to the data verify logic and the control logic, which reprograms floating gate cells having corresponding bit latches not storing the particular value.

6. The apparatus of claim 5, wherein the retry logic includes logic which counts reprogram retries and sets a reprogram limit on retries.

7. A floating gate memory circuit module on a semiconductor substrate, comprising:

a memory array including at least M rows and N columns of floating gate cells;

M word lines, each coupled to the floating gate cells in one of the M rows of floating gate cells;

a plurality of bit lines, each coupled to the floating gate cells in at least one of the N columns of floating gate cells;

a page buffer, including a plurality of bit latches coupled to corresponding ones of the plurality of bit lines, which supplies input data to the N columns of floating gate cells;

write control circuitry, coupled to the page buffer and the M word lines, which supplies programming voltages to a selected word line for programming input data to a row of floating gate cells accessed by the selected word line in response to the input data stored in the page buffer; and program verify circuitry, coupled to the page buffer, which verifies that floating gate cells are programmed with the input data in corresponding bit latches in the page buffer, and including logic coupled to the page buffer, and to the bit lines, that resets bit latches to a first binary value when stored data in a floating gate cell on a corresponding bit line matches a second binary value.

8. The floating gate memory circuit of claim 7, wherein:

a row of N columns of floating gate cells include a first page and a second page; and the page buffer supplies input data to a page of floating gate cells.

9. The floating gate memory circuit of claim 7, wherein the program verify circuitry includes logic responsive to stored data from the floating gate cells and to data in the page buffer to provide the program verified signal when all programmed floating gate cells pass program verify.

10. The floating gate memory circuit of claim 7, wherein the program verify circuitry generates a program verified signal when all bit latches store the first binary value.

11. The floating gate memory circuit of claim 10, wherein the write control circuitry applies a word line program potential to a word line coupled to a selected set of floating gate cells, and a bit line program potential to bit lines coupled to bit latches storing the second binary value.

12. A method of storing data in a memory array on an integrated circuit having M rows and N columns of floating gate memory cells comprising the steps of:

loading a page buffer on the integrated circuit with a row of input data;

selecting a row of memory cells for programming the input data to the row of memory cells;

programming the row of memory cells with the input data from the page buffer;

reading the row of memory cells to verify programming of the input data to the row of memory cells; and resetting the input data in the page buffer of successfully verified memory cells in the row of memory cells and in response to data remaining in the page buffer, retrying the steps of programming, reading, and resetting.

13. The method of claim 12 further comprises the step of selecting a subset of the N columns in the row of memory cells for programming the input data.

14. The method of claim 12, wherein the step of resetting the input data includes the step changing the input data stored in the page buffer from a program state to a do not program state.

15. The method of claim 12, wherein the step of programming the row memory cells includes the step of changing charge states stored in the floating gate memory cells when a data program state is stored in the page buffer.

16. The method of claim 12 wherein the step of loading a page buffer with a row of input data includes loading 16 bits of input data at a time to the page buffer.

17. The method of claim 12 wherein the step of programming the row memory cells with the input data from the page buffer includes programming one of 128, 256, 512 or 1024 bits of input data to the row memory cells.

18. A floating gate memory device, comprising:

a memory array including at least M rows and N columns of floating gate cells;

M word lines, each coupled to the floating gate cells in one of the M rows of floating gate cells;

N bit lines, each coupled to the floating gate cells in one of the N columns of floating gate cells;

N bit latches, each coupled to one of the N bit lines, which receives input data having a program state and a do not program state for the N columns of floating gate cells;

program circuitry, coupled to the N bit latches, the N bit lines and the M word lines, which applies programming voltages to a selected word line, and to bit lines coupled to bit latches storing a program state to program floating gate cells coupled to the N bit lines in parallel in response to data in the bit latches; and verify circuitry, coupled to the program circuitry, which senses the N columns of floating gate cells to reset the bit latches from the program state to the do not program state in response to properly programmed floating gate cells, and wherein the program circuitry retries programming the floating gate cells coupled corresponding to bit latches that remain in the program state.

19. The floating gate memory device of claim 18 wherein the verify circuitry provides an all cell verified signal when all page bit buffers are reset.

20. The floating gate memory device of claim 18 wherein the verify circuitry includes:

latches which store cell data from floating gate cells sensed during verify; and logic which resets the bit latches when corresponding cell data of the latches indicates a programmed state which verifies proper programming of the floating gate cell.

21. An apparatus for storing data, comprising:

a memory array having a plurality of floating gate cells;

supply circuits, coupled to the memory array, which apply voltages to the plurality of floating gate cells to read and program the plurality of floating gate cells in the memory array;

a plurality of bit latches, coupled to the memory array, which provide a buffer for storage of data to a set including at least a portion of a row of floating gate cells in the memory array;

control logic, coupled to the supply circuits and the bit latches, which controls the supply circuits to program the data in the plurality of bit latches to the set of floating gate cells; and automatic data verify circuits, coupled to the memory array and the plurality of bit latches, which verify successful programming of the data to the set of floating gate cells in the memory array, including verify logic, coupled to the bit latches and floating gate cells in the memory array, which reads the memory data from the floating gate cells and resets the corresponding bit latches when the read data indicates a programmed state.

22. The apparatus of claim 21, wherein:

each row of plurality of floating gate cells includes a first page and second page; and the set includes a page of floating gate cells.

23. The apparatus of claim 21, wherein:

the memory array includes at least M word lines and N bit lines coupled to the plurality of floating gate cells; and the plurality of bit latches includes one bit latch for each of the N bit lines;

and N is greater than 32.

24. The apparatus of claim 21, wherein the data verify circuits include output logic, coupled to the verify logic of each floating gate cell being verified, which provides a data verified signal when all bit latches store a particular binary value.

25. The apparatus of claim 21, further comprising retry logic, coupled to the data verify logic and the control logic, which reprograms floating gate cells having corresponding bit latches not storing the particular value.

26. The apparatus of claim 25, wherein the retry logic includes logic which counts reprogram retries and sets a reprogram limit on retries.

* * * * *